(12) United States Patent       (10) Patent No.:     US 7,990,226 B1
Aycock                          (45) Date of Patent:      Aug. 2, 2011

(54) NON-LINEAR CRYSTAL OSCILLATOR CAPACITIVE LOAD CIRCUITS

(75) Inventor: Stephen E. Aycock, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 88 days.

(21) Appl. No.: 12/463,749

(22) Filed: May 11, 2009

(51) Int. Cl.
    *H03B 5/32* (2006.01)
(52) U.S. Cl. .................................. 331/158; 331/177 V
(58) Field of Classification Search .................. 331/158, 331/177 V
    See application file for complete search history.

(56) References Cited

U.S. PATENT DOCUMENTS

| 5,764,111 | A | 6/1998 | Bushman | |
| 7,352,255 | B1* | 4/2008 | Green | 331/158 |
| 7,639,092 | B2* | 12/2009 | Shen et al. | 331/36 C |
| 2002/0149435 | A1* | 10/2002 | Babcock | 331/158 |
| 2006/0132110 | A1* | 6/2006 | Tang | 323/282 |
| 2006/0267701 | A1* | 11/2006 | Eilers | 331/158 |
| 2009/0261914 | A1* | 10/2009 | Kao et al. | 331/158 |

* cited by examiner

*Primary Examiner* — Joseph Chang
(74) *Attorney, Agent, or Firm* — Myers Bigel, et al.

(57) ABSTRACT

A load circuit for a crystal oscillator includes a plurality of capacitors and a load control circuit configured to selectively add the capacitors to a load at a terminal of the crystal oscillator responsive to a command signal to provide a non-linear capacitive load at the terminal of the crystal oscillator that compensates for a non-linearity of a frequency versus load capacitance characteristic of the crystal oscillator. The load circuit may include a plurality of switches, respective ones of which are configured to load a terminal of the crystal oscillator with respective ones of the capacitors, and control circuit configured to control the plurality of switches to load the terminal of the crystal oscillator responsive to a binary command signal such that respective single ones of the switches operates in response to respective quantum changes a binary command signal over an operating range of the binary command signal.

7 Claims, 5 Drawing Sheets

NON-LINEAR CRYSTAL OSCILLATOR CAPACITIVE LOAD CIRCUITS

BACKGROUND OF THE INVENTION

This invention relates to crystal oscillator circuits and operating methods thereof and, more particularly, to capacitive load circuits for crystal oscillators and operating methods thereof.

Crystal oscillators are widely used in electronic devices. For example, a satellite television set-top box may include a voltage-controlled crystal oscillator (VCXO) circuit that is used to tune a reference signal of a receiver circuit of the set-top box. The set-top box's receiver circuit may include a control loop that generates a pulse-width-modulated (PWM) frequency command signal that is filtered by a low-pass RC filter and applied to an analog VCXO that controls the frequency of a signal generated from a crystal oscillator responsive to the filtered signal. In particular, the VCXO control circuit may capacitively load the crystal oscillator to "pull" its output frequency over a range around its resonant frequency. An example of a conventional VCXO circuit is described in U.S. Pat. No. 5,764,111 to Bal et al.

SUMMARY OF THE INVENTION

In some embodiments of the present invention, a load circuit for a crystal oscillator includes a plurality of capacitors and a load control circuit configured to selectively add the capacitors to a load at a terminal of the crystal oscillator responsive to a command signal to provide a non-linear capacitive load at the terminal of the crystal oscillator. The capacitors and the load control circuit may provide a non-linear capacitive load that compensates for a non-linearity of a frequency versus load capacitance characteristic of a crystal of the crystal oscillator.

In some embodiments, the load control circuit includes a detector circuit configured to receive a pulse-width-modulated (PWM) command signal and to generate a binary command signal therefrom. The load control circuit also includes a converter circuit configured to generate a plurality of switch control signals from the binary command signal according to a binary code to thermometer code conversion. The load control circuit further includes a plurality of switches, respective ones of which are configured to add and subtract respective ones of the capacitors to and from the load responsive to respective ones of the switch control signals. The detector circuit may be configured to generate a measure of a duty cycle of the PWM command signal and to generate the binary command signal from the measure of the duty cycle.

In additional embodiments of the present invention, a load circuit for a crystal oscillator includes a plurality of capacitors and a plurality of switches, respective ones of which are configured to load a terminal of the crystal oscillator with respective ones of the capacitors. The load circuit further includes a control circuit configured to control the plurality of switches to load the terminal of the crystal oscillator responsive to a binary command signal such that respective single ones of the switches operates in response to respective quantum changes in the binary command signal over an operating range of the binary command signal. The capacitors may be non-uniform in capacitance, and may be configured to provide a non-linear capacitive load of the crystal oscillator terminal over the operating range of the binary command signal that compensates for a non-linearity of a frequency versus load capacitance characteristic of a crystal of the crystal oscillator.

In some embodiments, respective ones of the switches are configured to add and subtract respective ones of the capacitors to and from a load at the terminal of the crystal oscillator responsive to respective ones of a plurality of switch control signals. The control circuit includes a converter circuit configured to generate the switch control signals from a binary command signal according to a binary code to thermometer code conversion. The control circuit may further include a detector circuit configured to generate a measure of a duty cycle of a pulse-width-modulated (PWM) command signal and to generate the binary command signal from the measure of the duty cycle.

In method embodiments of the present invention, an output frequency of a crystal oscillator is controlled by selectively adding discrete capacitors to a load at a terminal of the crystal oscillator responsive to a command signal to provide a non-linear capacitive load at the terminal of the crystal oscillator. Selectively adding discrete capacitors to a load at a terminal of the crystal oscillator responsive to a command signal to provide a non-linear capacitive load at the terminal of the crystal oscillator may compensate for a non-linearity of a frequency versus load capacitance characteristic of the crystal oscillator. Selectively adding discrete capacitors to a load at a terminal of the crystal oscillator responsive to a command signal to provide a non-linear capacitive load at the terminal of the crystal oscillator may include selectively adding the capacitors to the load responsive to a binary command signal such that respective single ones of the capacitors is added in response to respective quantum changes in the binary command signal over an operating range of the binary command signal. The capacitors may be non-uniform in capacitance.

DETAILED DESCRIPTION

Figure 1:
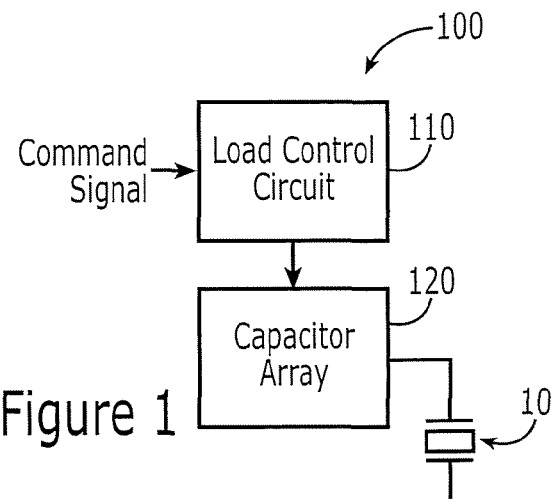
FIG. 1 is schematic diagram illustrating a crystal oscillator load circuit according to some embodiments of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element is referred to as being "connected to" or "coupled to" another element (and variants thereof), it can be directly connected or coupled to the other element or intervening elements may be present. In contrast, when an element is referred to as being "directly connected to" or "directly coupled to" another element, there are no intervening elements present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements and/or components, these elements and/or components are not limited by these terms. These teens are only used to distinguish one element or component from another element or component. Thus, a first element or component discussed below could be termed a second element or component without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all term is (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a crystal oscillator load circuit 100 according to some embodiments of the present invention. The load circuit 100 includes a capacitor array 120 including a plurality of capacitors. The load circuit 100 further includes a load control circuit 110 configured to selectively load a crystal oscillator 10 with capacitors from the capacitor array 120 responsive to a command signal, thereby adjusting (or "pulling") a frequency of a signal produced by the crystal oscillator 10 responsive to the command signal. More particularly, the load control circuit 110 may non-linearly load the terminal of the crystal oscillator 10 responsive to the command signal to thereby compensate for non-linearity of a frequency versus capacitive load characteristic of the crystal oscillator 10 over a range of the command signal. The command signal may, for example, be a command signal generated by a frequency control loop in an electronic circuit, such as a receiver circuit of a satellite television set-top box.

Figure 2:
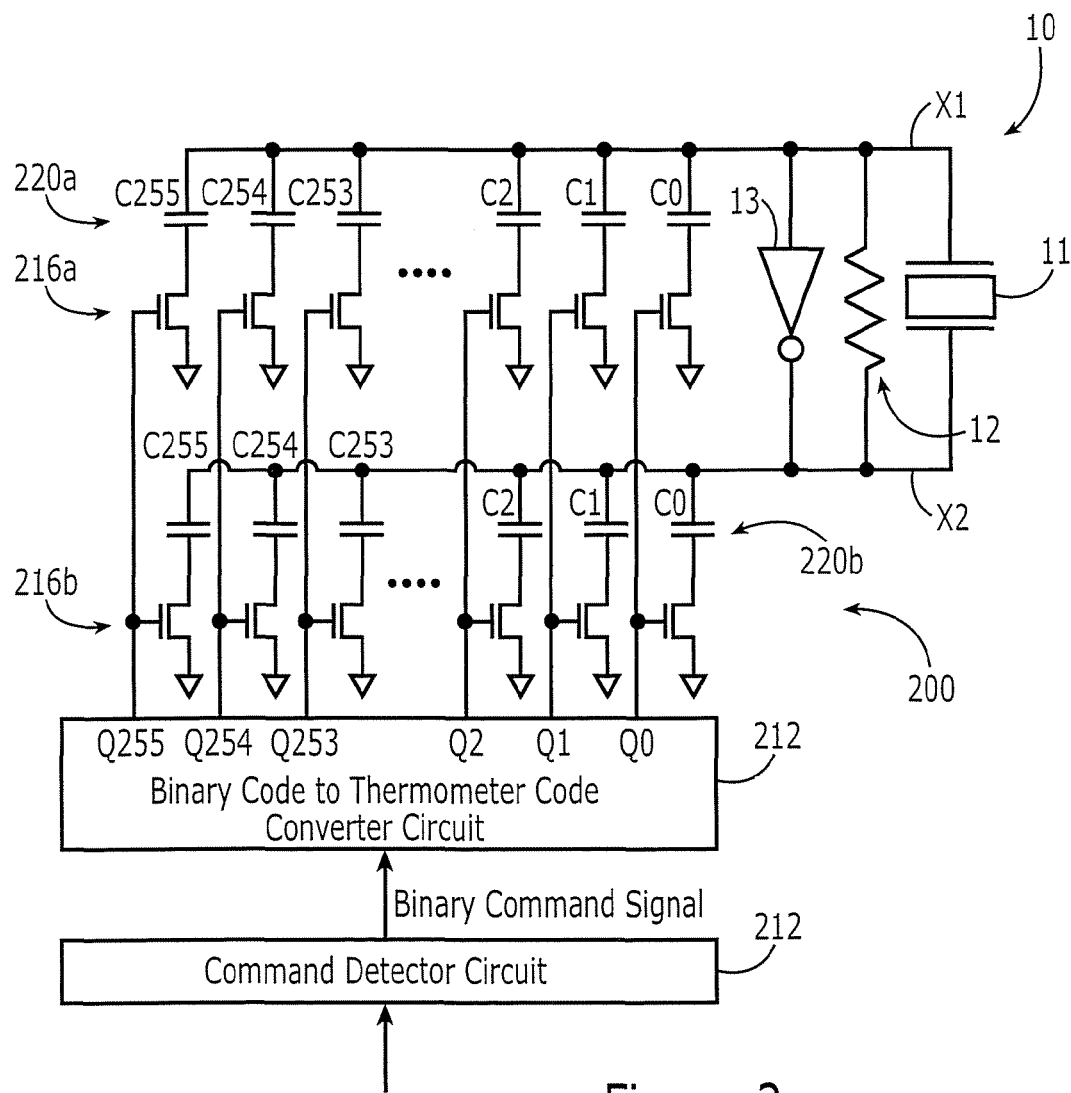
FIG. 2 is a schematic diagram illustrating a crystal oscillator load circuit according to further embodiments of the present invention.
Figure 3:
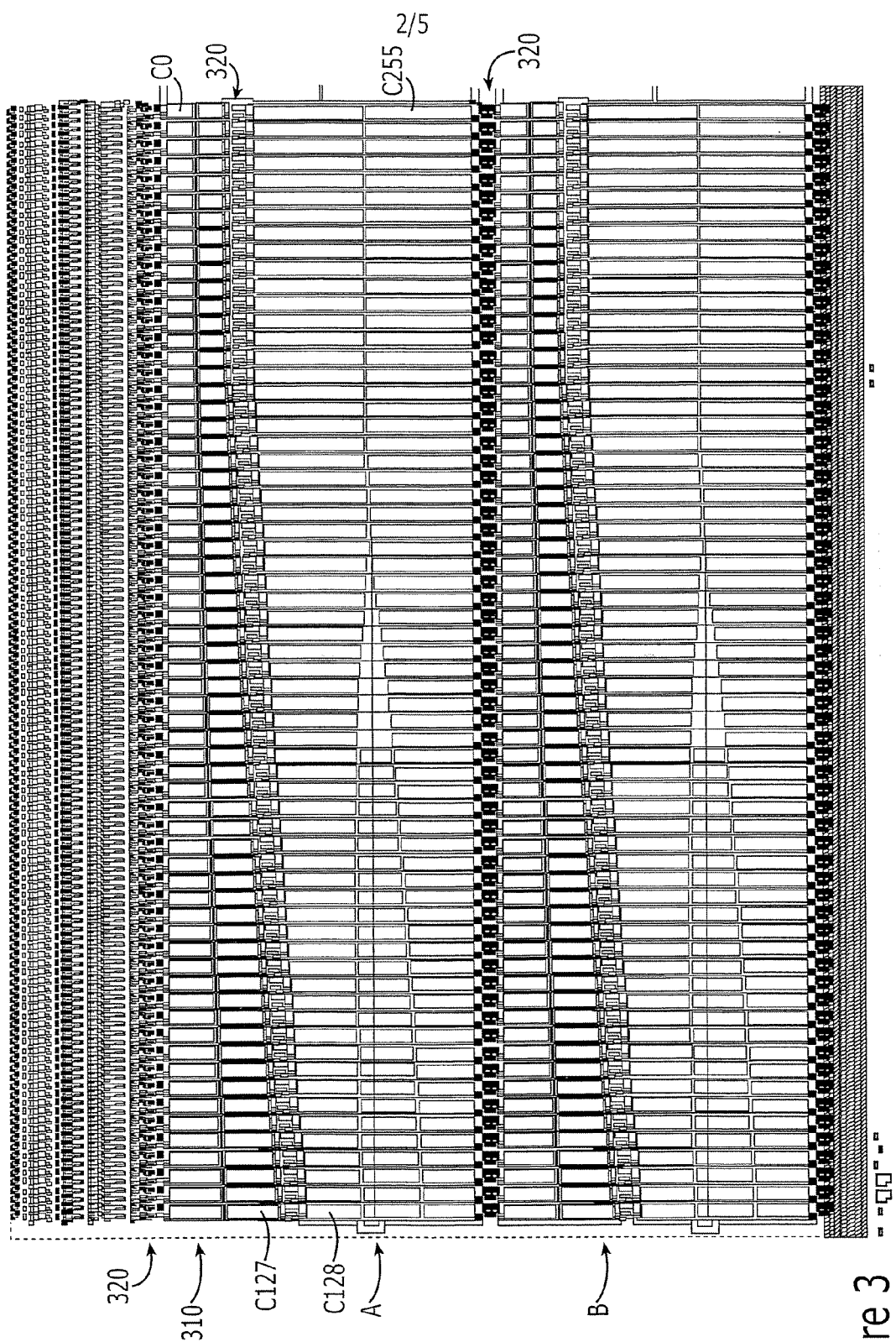
FIG. 3 is a layout diagram illustrating a switched capacitor array layout for a crystal oscillator load circuit according to some embodiments of the present invention.

FIGS. 2 and 3 illustrate an exemplary implementation according to further embodiments of the present invention. First and second capacitor arrays 220a, 220b each include capacitors C0, ..., C255 having non-uniform capacitances. The capacitors in the respective arrays 220a, 220b are connected in common to respective terminals X1, X2 of a crystal oscillator 10, which includes a crystal 11, a feedback resistor 12 and an inverter 13. A capacitive load control circuit 200 may include respective banks 216a, 216b of switches that are coupled to the respective capacitor arrays 220a, 220b. Respective ones of the switches in the banks 216a, 216b are configured to couple and decouple respective capacitors C0, ..., C255 to and from a ground (or other reference) node responsive to control signals Q0, ..., Q255.

The capacitive load control circuit 200 further includes a binary code to thermometer code converter circuit 214 that generates the respective control signals Q0, ..., Q255 that control the switches in the banks 216a, 216b. In particular, the binary code to thermometer code converter circuit 214 is configured to receive a binary command signal and to responsively generate a thermometer code output Q0, ..., Q255 to control the switches such that, over an operating (full) range of the binary command signal, each quantum (1 bit magnitude) change in the binary command signal results in operation of only one of the switches in each of the banks 216a, 216b. This conversion thus may limit transient effects that might arise from switching multiple capacitors at the same time. As further shown in FIG. 2, the binary command signal applied to the binary code to thermometer code converter circuit 214 may be generated from a PWM command signal by a command detector circuit 212, such that the circuit may be used, for example, as a replacement for an analog VXCO in a set-top box frequency control loop as discussed above.

Referring to FIGS. 2 and 3, in some embodiments, the capacitors C0, ..., C255 may include microelectronic capacitors of non-uniform size that are arranged in rows 310 on a microelectronic substrate. In the particular embodiments illustrated in FIG. 3, switched capacitor array units A, B are provided for coupling to respective terminals X1 and X2 of the crystal oscillator 10, shown as including a crystal 11, a feedback resistor 12 and an inverter 13. The capacitors in the respective units A, B are connected in common to respective underlying conductors (not shown) that are configured to be connected to the respective terminals X1, X2 of the crystal oscillator. As further shown in FIG. 3, switches for connecting the capacitors C0, ..., C255 to a ground conductor (not shown) may be arranged in rows 310 disposed between the rows 310 of capacitors.

A change in frequency $$\frac{\Delta f}{f}$$

in parts per million (PPM) as a function of change in load capacitance of a crystal oscillator may be given by the following relation:

$$\frac{\Delta f}{f} = \frac{f_{CL1} - f_{CL2}}{f_{CL2}} = \frac{C_1}{2}\left(\frac{1}{(C_0 + C_{L1})} - \frac{1}{(C_0 + C_{L2})}\right), \quad (1)$$

where $f_{CL1}$ and $f_{CL2}$ are respective frequencies at respective load capacitances $C_{L1}$ and $C_{L2}$ and $C_0$ and $C_1$ are shunt and motional capacitances, respectively, of the crystal oscillator (typically specified by the manufacturer). According to some embodiments of the present invention, equation (1) may be used to size the capacitors C0, ..., C255 such that they compensate for the non-linearity in the frequency versus load capacitance characteristics of the crystal oscillator, thereby constraining the crystal output frequency to be approximately a linear function of the binary command signal over the operating range of the binary command signal. It will be understood, however, that the capacitors C0, ..., C255 could be tailored to provide other performance characteristics.

The crystals commonly used for VCXO circuits have crystal shunt capacitance ($C_0$) values of 8 pF, 10 pF, 12 pF, or 14 pF, and the crystals are specifically designed to be "pullable." In a parallel resonant crystal circuit, such as that shown in FIG. 2, a capacitance equal to the crystal $C_0$ capacitance is applied between the X1 and X2 terminals for the crystal to resonate at its zero ppm frequency. Adding more or less capacitance than $C_0$ will "pull" the crystal frequency lower or higher. A typical VCXO crystal can be pulled +/−150 parts-per-million (ppm). For a 27 MHz crystal, one ppm is 27 Hz. The capacitor arrays 220a, 220b are electrically in series with each other so their combined capacitive load applied between the X1 and X2 terminals is:

$$C_L = \frac{C_{220a} * C_{200b}}{(C_{200a} + C_{200b})}, \quad (2)$$

where $C_{220a}$ and $C_{220b}$ are the respective capacitances of the capacitor arrays 220a, 220b. In a practical design, there are also parasitic capacitances present on the terminals X1, X2. The desired capacitive load $C_{zero\_ppm}$ applied to the crystal for zero ppm pull may therefore be expressed as:

$$C_{zero\_ppm} = C_0 = C_L + C_{PARASITIC}, \quad (3)$$

where $C_{PARASITIC}$ is the parasitic capacitance at the terminals X1, X2. For the bank capacitance $C_{220a}$ at binary code 01111111 to meet the zero ppm point:

$$C_{200a} = 2*C_0 - 2*C_{PARASITIC}. \quad (4)$$

This zero ppm capacitance value for $C_{220a}$ is the total capacitance needed for binary code 01111111. The individual capacitor values for all 256 capacitors can now be determined by equation (1) using a crystal with known values of $C_0$ and $C_1$ and using increments of:

$$\Delta f = \frac{300 \text{ ppm total pull range}}{256 \text{ binary steps}}. \quad (5)$$

Figure 4:
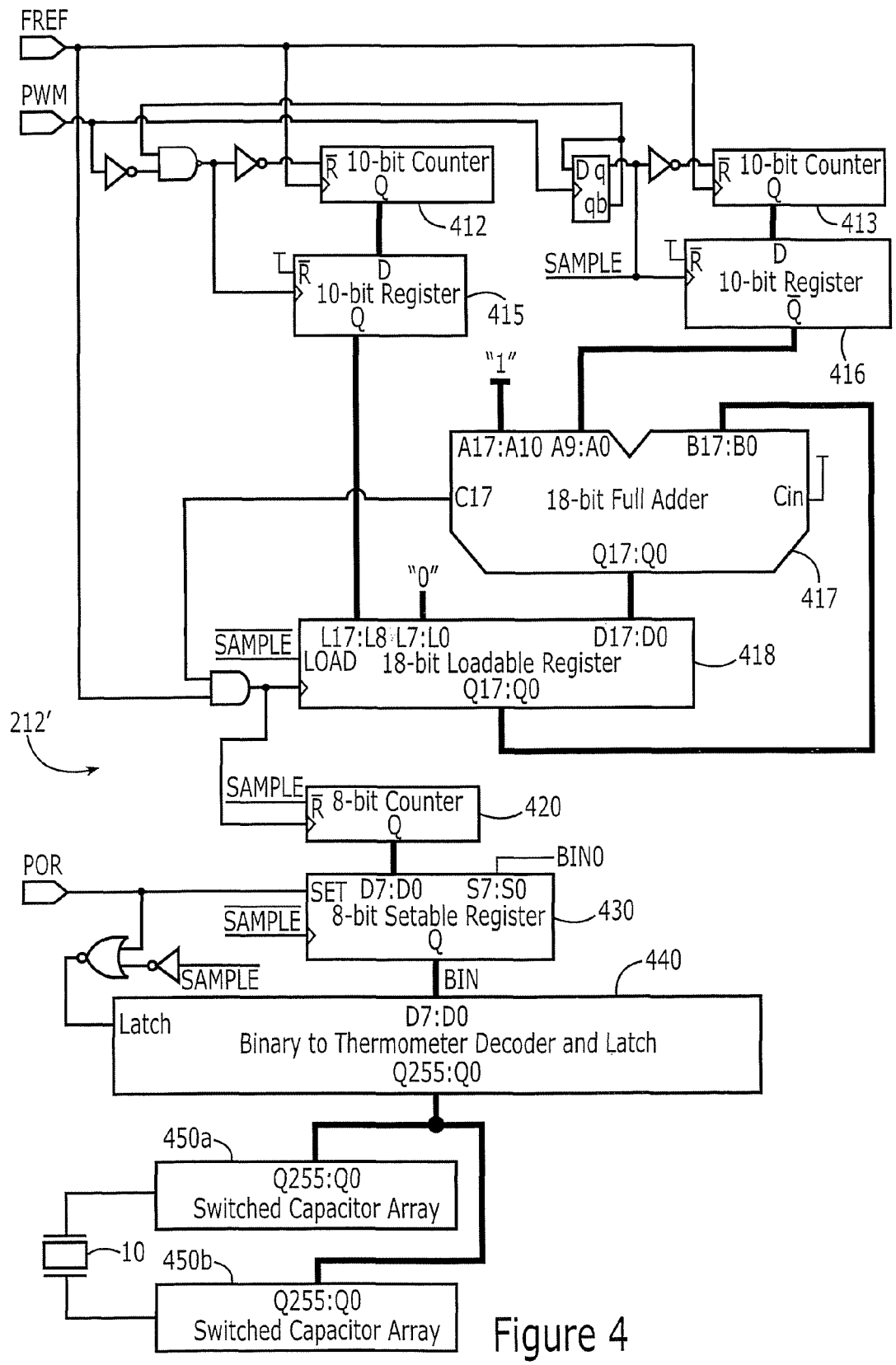
FIGS. 4 and 5 are schematic diagrams illustrating crystal oscillator load circuits according to further embodiments of the present invention.
Figure 5:
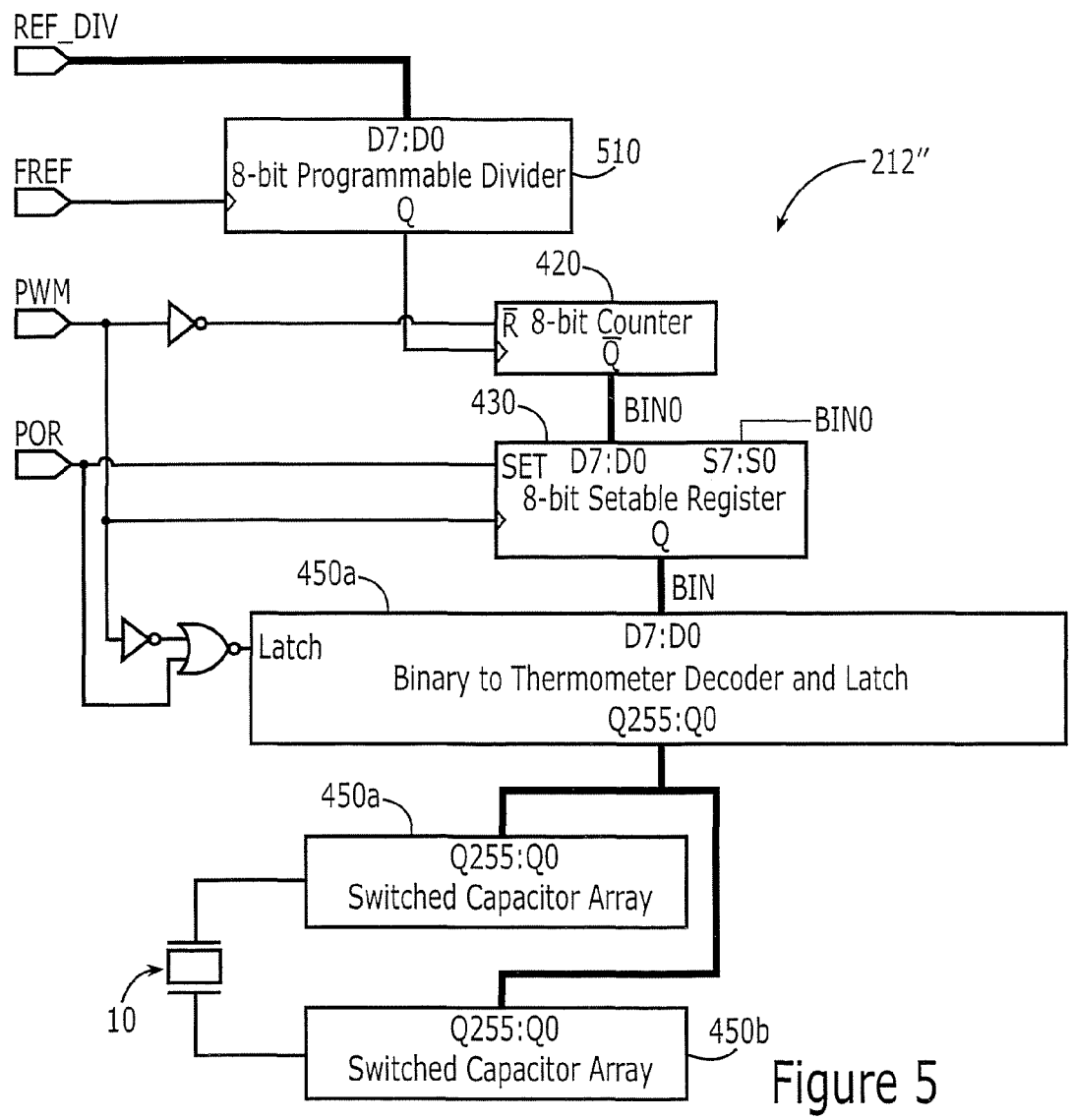

FIGS. 4 and 5 illustrate exemplary implementations of the command detector circuit 212 of FIG. 3. A command detector circuit 212' shown in FIG. 4 includes logic circuitry configured to generate an 8-bit binary signal BIN, which represents a measure of a duty cycle of a pulse-width modulated command signal PWM. The logic circuitry receives a clock signal FREF, which may be derived from the signal output by a crystal oscillator 10. The clock signal FREF is applied to clock inputs of two 10-bit counter circuits 412, 413 that are reset responsive to the command signal PWM. Outputs of the counter circuit 412, 413 are applied to inputs of respective 10-bit register circuits 415, 416 that are clocked responsive to the command signal PWM and a sample signal SAMPLE, respectively. An output of the register circuit 416 is applied to a less significant portion A9:0 of a first addend input A17:0 of an 18-bit adder circuit 417, while an output of the register circuit 415 is applied to an input of an 18-bit loadable register circuit 418, which also receives the output of the adder circuit 417 and has an output that is fed back to a second addend input B17:0 of the adder circuit 417. A carry signal generated at a carry output C17 of the adder circuit 417 is used to gate application of the clock signal FREF to a clock input of the register circuit 418 and a clock input of an 8-bit counter circuit 420.

The output of the counter circuit 420 is applied to an 8-bit settable register 430, which generates the binary command signal BIN. In particular, the binary command signal BIN is a binary value corresponding to a number cycles of the clock signal FREF occurring during a "low" portion of a cycle of the command signal PWM. The binary command signal BIN is applied to a binary to thermometer decoder and latch circuit 440, which produces a thermometer-coded output signal Q255:0 that is applied to first and second switched capacitor arrays 450a, 450b connected to respective terminals of a crystal oscillator 10. Capacitors in the arrays 450a, 450b are selectively coupled to the terminals of the crystal oscillator 110 responsive to the thermometer-coded output signal Q255:0, along lines discussed above with reference to FIG. 2.

The register circuit 430 latches the binary command signal BIN responsive to a complement of the sample signal SAMPLE. As additionally illustrated in FIG. 4, the 8-bit register circuit 430 may be reset to a predetermined value responsive to a power on reset signal POR. In particular, a particular predetermined binary value BIN0 may be loaded into the register via a set input of the register 430 to establish a desired initial load. For example, the predetermined binary value BIN0 may be a value that loads the respective terminals of the crystal oscillator with approximately half the respective available capacitance of the arrays 450a, 450b such that, upon power up, the amount of capacitive load is around the middle of a range of operation of the circuit. This approach may help ensure reliable startup of the crystal oscillator 10 and may help the frequency control loop more quickly achieve steady-state operation.

Mathematically, the counters 412, 413 in the circuit of FIG. 4 count the number of periods of the clock signal FREF occurring in the "low" portion of a period of the command signal PWM and the total period of the command signal PWM, respectively. The period of the command signal PWM is nomialized to the total number of available capacitors and the number of capacitors to be applied to the crystal oscillator 10 are determined using the adder circuit 417, register 418 and counter 420. The number of capacitors to be applied to the crystal oscillator 10 is represented by the binary command signal BIN. In particular:

$$\text{\# capacitors} = \left(\frac{\text{\# clock cycles } PWM \text{ low}}{\text{\# clock cycles } PWM \text{ total}}\right) \times \text{\# capacitors total}. \quad (6)$$

FIG. 5 illustrates an alternative implementation to the circuit shown in FIG. 4. In FIGS. 4 and 5, like reference designators identify like components. In FIG. 5, a command detector circuit 212" includes logic circuitry configured to generate an 8-bit binary signal BIN representative of a duty cycle of a pulse-width modulated command signal PWM using a user-supplied divisor for the clock signal FREF. In particular, the command detector circuit 212" includes an 8-bit programmable divider circuit 510 that generates a divided clock signal DIV_CLK from the clock signal FREF responsive to a divisor signal REF_DIV. The divisor signal REF_DIV may be supplied, for example, from a user-programmable memory, such as a programmable register or EEPROM. The divided clock signal DIV_CLK is used to clock an 8-bit counter circuit 420 that is reset responsive to a pulse-width modulated command signal PWM. The output of the counter circuit 420 is latched into an 8-bit settable register circuit 430 responsive to the command signal PWM, thus generating a binary command signal BIN that corresponds to the number of cycles of the divided clock signal DIV_CLK occurring during a "low" period of the command signal PWM. The remaining components of the circuit of FIG. 5 operate in the manner of like components of the circuit of FIG. 4.

The divisor signal REF_DIV may be determined based on the frequency of the command signal PWM, the frequency of the clock signal FREF and the number of available capacitors. For the illustrated example, the following relation may be used to determine the appropriate divisor:

$$f(FREF) < \frac{1}{\left(\frac{PWM\_period}{\# capacitors\ total}\right)}. \qquad (7)$$
$$\phantom{f(FREF) < }\frac{}{REF\_DIV}$$

For 256 total capacitors, a frequency of the clock signal FREF of 25 MHz and frequency of the command signal PWM of 1 kHZ, solving for REF_DIV:

$$REF\_DIV > \frac{1}{\left(\frac{25 \times 10^6 \times 0.001}{256}\right)} = 97.65. \qquad (8)$$

Therefore, a divisor REF_DIV of 98 may be used to maximize the range provided by the capacitors in the arrays 450a, 450b.

Figure 6:
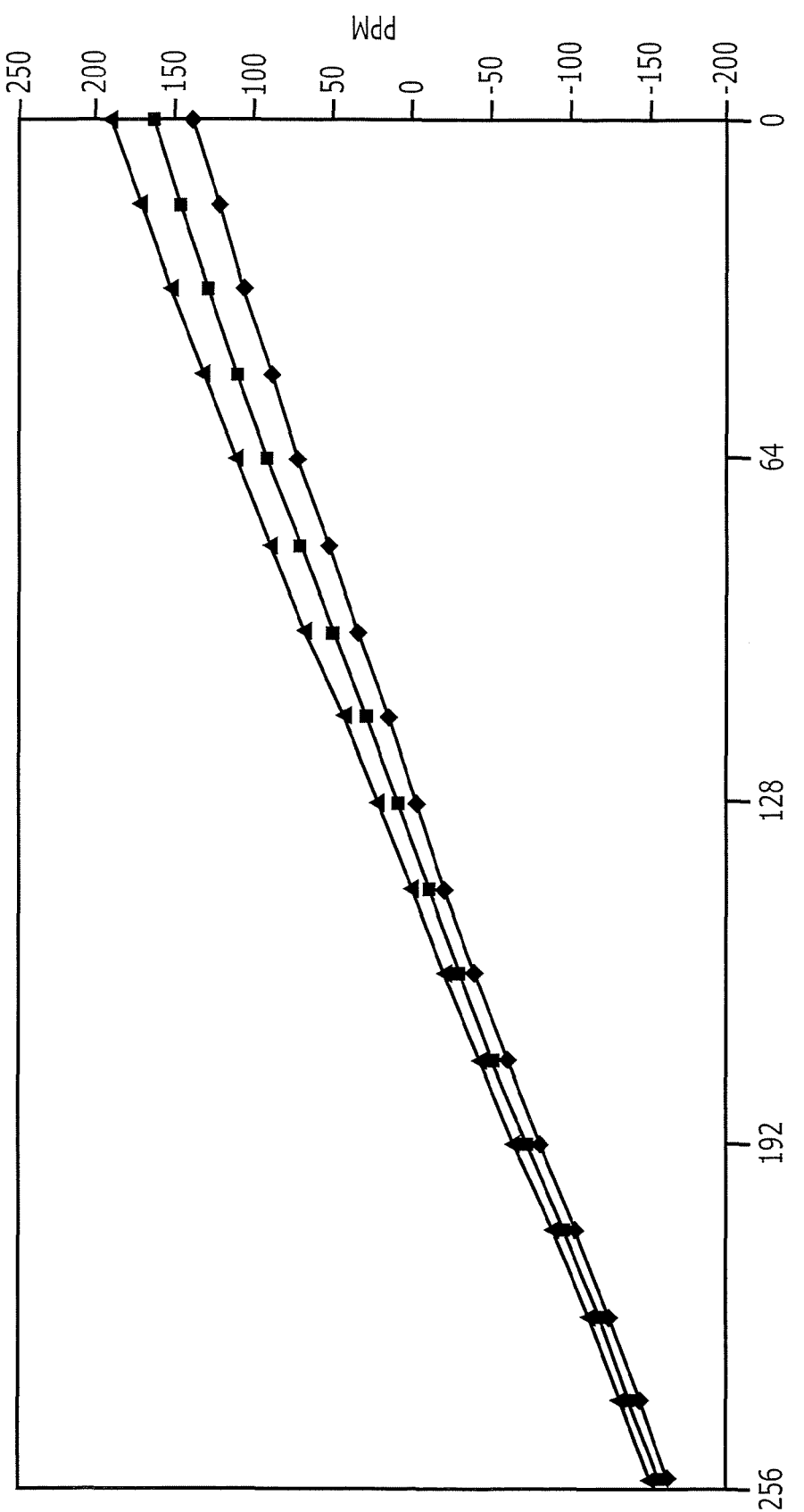
FIG. 6 is a diagram illustrating a frequency versus number of applied load capacitors for a crystal oscillator loaded by a load circuit according to some embodiments of the present invention.

FIG. 6 illustrates a frequency range for a nominal 27 MHz crystal oscillator that may be produced using a 256-capacitor array in a crystal oscillator load circuit according to some embodiments of the present invention. The curves in the figure illustrate frequency in parts per million (PPM) (ordinate) with respect to the number of applied capacitors (abscissa). Additional fixed selectable capacitors can be used to provide a bias to adjust the ppm pull range. FIG. 6 shows the effect of two additional fixed capacitors. The curve with triangle markings has both additional capacitors turned off. The curve with square markings has one additional capacitor turned on and the curve with diamond markings has both additional capacitors turned on. These additional capacitors may be used to help center the pull curve at code 01111111=0 ppm. These additional capacitors may be used to offset part-to-part process variations. As can be seen from FIG. 6, embodiments of the present invention may produce an operating frequency range of approximately 300 parts per million (PPM) or greater.

It will be appreciated that the embodiments described above with reference to FIGS. 1-6 are provided for purposes of illustration and that the present invention is not limited to such embodiments. For example, in other embodiments of the present invention, capacitor arrays with different numbers of capacitors may be used. In some embodiments, capacitive loading applied to the two terminals of a crystal oscillator may not be the same, e.g., the capacitive loading on one terminal may be made larger than the capacitive loading on the other terminal to compensate for signal losses through the crystal. In some embodiments, a variable capacitive load circuit along the lines discussed above may be applied to one terminal of a crystal while applying a fixed or other type of load to the other terminal. In further embodiments, a binary command signal may be directly supplied to a capacitive load circuit along the lines discussed above, instead of converting a PWM or other type of command signal. In additional embodiments, a PWM command signal input capability as discussed above could be combined with such a direct binary input capability (e.g., using an I²C interface) for diagnostic or other purposes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A load circuit for a crystal oscillator, comprising:
    a plurality of capacitors; and
    a load control circuit configured to selectively add the capacitors to a load at a terminal of the crystal oscillator responsive to a command signal to provide a non-linear capacitive load at the terminal of the crystal oscillator, wherein the load control circuit comprises:
        a detector circuit configured to receive a pulse-width-modulated (PWM) command signal and to generate a binary command signal therefrom;
        a converter circuit configured to generate a plurality of switch control signals from the binary command signal according to a binary code to thermometer code conversion; and
        a plurality of switches, respective ones of which are configured to add and subtract respective ones of the capacitors to and from the load responsive to respective ones of the switch control signals.

2. The load circuit of claim 1, wherein the detector circuit is configured to generate a measure of a duty cycle of the PWM command signal and to generate the binary command signal from the measure of the duty cycle.

3. The load circuit of claim 1, wherein the load control circuit is configured to initially load the terminal with a predetermined number of the capacitors responsive to a control signal.

4. The load circuit of claim 1, wherein the terminal comprises an input terminal and/or an output terminal of the crystal oscillator.

5. A load circuit for a crystal oscillator, comprising:
    a plurality of capacitors;
    a plurality of switches, respective ones of which are configured to load a terminal of the crystal oscillator with respective ones of the capacitors; and
    a switch control circuit configured to control the plurality of switches to load the terminal of the crystal oscillator responsive to a binary command signal such that respective single ones of the switches operates in response to respective quantum changes in the binary command signal over an operating range of the binary command signal, wherein respective ones of the switches are configured to add and subtract respective ones of the capacitors to and from a load at the terminal of the crystal oscillator responsive to respective ones of a plurality of switch control signals and wherein the switch control circuit comprises a converter circuit configured to generate the switch control signals from a binary command signal according to a binary code to thermometer code conversion.

6. The load circuit of claim 5, wherein the switch control circuit further comprises a detector circuit configured to generate a measure of a duty cycle of a pulse-width-modulated (PWM) command signal and to generate the binary command signal from the measure of the duty cycle.

7. A method of controlling an output frequency of a crystal oscillator, the method comprising:
    generating a binary command signal from a pulse-width-modulated (PWM) command signal;

selectively adding discrete capacitors to a load at a terminal of the crystal oscillator responsive to a command signal to provide a non-linear capacitive load at the terminal of the crystal oscillator by selectively adding the capacitors to the load responsive to the binary command signal such that respective single ones of the capacitors is added in response to respective quantum changes in the binary command signal over an operating range of the binary command signal, wherein selectively adding the capacitors to the load responsive to the binary command signal comprises:

generating a plurality of switch control signals from the binary command signal according to a binary code to thermometer code conversion; and operating respective ones of a plurality of switches responsive to respective ones of the switch control switches to thereby add and subtract respective ones of the capacitors to and from the load.

* * * * *